US006646877B2

(12) United States Patent
Willers et al.

(10) Patent No.: US 6,646,877 B2
(45) Date of Patent: Nov. 11, 2003

(54) COOLING SYSTEM

(76) Inventors: Arthur G. Willers, 183 Westover Dr., Delran, NJ (US) 08075-2224; Stanton Kent, 449 Tomlinson Ave., Laurel Springs, NJ (US) 08021

( * ) Notice: Subject to any disclaimer, the term of this patent is extended or adjusted under 35 U.S.C. 154(b) by 0 days.

(21) Appl. No.: 09/817,542

(22) Filed: Mar. 26, 2001

(65) Prior Publication Data

US 2002/0167797 A1 Nov. 14, 2002

Related U.S. Application Data

(60) Provisional application No. 60/254,091, filed on Dec. 8, 2000.

(51) Int. Cl.[7] .................................................. H05K 7/20
(52) U.S. Cl. ........................ 361/695; 361/686; 361/687; 165/104.34; 165/126; 454/184
(58) Field of Search ................................ 361/683–687, 361/692, 695, 721–726, 727; 165/104.34, 101, 185, 126, 127; 364/707, 708.1, 557, 556, 483; 174/16.3, 15.1; 236/49.3, 94; 313/13; 62/407–408, 413–417; 307/118; 202/64.65; 318/806, 811, 254, 432; 312/223.1, 223.2, 223.3; 454/184

(56) References Cited

U.S. PATENT DOCUMENTS

| | | | | |
|---|---|---|---|---|
| 3,903,404 A | * | 9/1975 | Beall et al. ................. 317/100 |
| 4,756,473 A | * | 7/1988 | Takemae et al. ............. 236/49 |
| 4,834,629 A | | 5/1989 | Tateishi ....................... 417/423 |
| 5,079,542 A | * | 1/1992 | Umezawa .................... 340/587 |
| 5,121,291 A | * | 6/1992 | Cope et al. .................. 361/384 |
| 5,132,628 A | * | 7/1992 | Matsuo ........................ 324/511 |
| 5,136,465 A | | 8/1992 | Benck et al. ................ 361/384 |
| 5,333,783 A | | 8/1994 | Catan ........................... 236/13 |
| 5,410,448 A | * | 4/1995 | Barker et al. ............... 631/695 |
| 5,438,226 A | * | 8/1995 | Kuchta ........................ 307/125 |
| 5,450,730 A | | 9/1995 | Calton et al. ................... 62/94 |
| 5,491,610 A | * | 2/1996 | Mok et al. ................... 631/695 |
| 5,526,289 A | * | 6/1996 | Dinh et al. .................. 364/557 |
| 5,528,454 A | * | 6/1996 | Niklos ......................... 361/695 |
| 5,951,137 A | | 9/1999 | Bortz .......................... 353/96 |
| 5,963,887 A | * | 10/1999 | Giorgio ....................... 702/64 |
| 5,999,403 A | | 12/1999 | Neustadt ..................... 361/695 |

(List continued on next page.)

FOREIGN PATENT DOCUMENTS

JP 410041661 A * 2/1998 ............ H05K/7/20

OTHER PUBLICATIONS

Shafer, T., "Methods for Monitoring Fan Performance," www.comairrotron.com/Engineering/MonitorFanPerf.htm pp. 1–5 (Nov. 7, 2000).

Shafer, T., "Different Methods to Control Fan Speed," www.comairrotron.com/Engineering?ControlFanSpeed.htm pp. 1–3 (Nov. 7, 2000).

Application Engineering, "Fault–Tolerant Fan (FTF) Systems; Now Easily Accomplished," www.comairrotron.com/Engineering/FTF.htm pp. 1–2 (Nov. 7, 2000).

Website, "Air Flow Vs. Pressure Characteristics," www.comairrotron.com/Engineering/airflow.htm pp. 1–3 (Nov. 7, 2000).

*Primary Examiner*—Michael Datskovsky
(74) *Attorney, Agent, or Firm*—Beck & Tysver, P.L.L.C.

(57) ABSTRACT

A system for cooling telecommunications device includes an air inducing mechanism which pushes air into an enclosure of the device and an air exhaust mechanism which exhausts the air from the enclosure. The rate at which the air is pushed into the enclosure is less than the rate at which the air is expelled from the enclosure and these two rates are controlled such that the pressure differential between the pressure within the enclosure and the ambient pressure outside the enclosure is minimized. By minimizing this pressure drop, the airflow mechanisms are able to operate more efficiently, that is, they are able to operate at substantially near their design speed.

18 Claims, 4 Drawing Sheets

U.S. PATENT DOCUMENTS

| | | | |
|---|---|---|---|
| 6,018,456 A | 1/2000 | Young et al. | 361/684 |
| 6,075,698 A | 6/2000 | Hogan et al. | 361/695 |
| 6,077,160 A | 6/2000 | Franaszek et al. | 454/292 |
| 6,115,250 A * | 9/2000 | Schmitt | 361/695 |
| 6,368,064 B1 * | 4/2002 | Bendikas et al. | 417/2 |
| 6,396,688 B1 * | 5/2002 | Davies et al. | 361/687 |
| 6,428,282 B1 * | 8/2002 | Langley | 417/2 |

* cited by examiner

COOLING SYSTEM

RELATED APPLICATION

This application claims the benefit of U.S. Provisional Application No. 60/254,091, filed on Dec. 8, 2000. The entire teachings of the above application is incorporated herein by reference.

BACKGROUND OF THE INVENTION

To protect telecommunications devices, such as computers, from extreme temperatures, cooling systems are used to maintain a desired temperature inside enclosures housing the electronic components of the devices. For example, conventional air apertures, such as openings in the enclosures, are employed to facilitate the circulation of air about the electronic components. Fans can also be used with the apertures, either integrated within or mounted to the enclosure, to exhaust air from the enclosure after the air has circulated about the electronic components.

SUMMARY OF THE INVENTION

Typically, conventional air apertures operate inefficiently. For instance, there may be an air filter covering the aperture that becomes blocked up with dust over time. In some devices, the energy release by the components is large enough to require the use of fans. Fans that only exhaust air from an enclosure or only push air into the enclosure operate inefficiently because of the large pressure differential between the pressure within the enclosure and the ambient pressure outside the enclosure.

The present invention implements a system for cooling telecommunications devices. Specifically, in one aspect of the invention, the cooling system includes an air inducing mechanism which pushes air into an enclosure of the device, and an air exhaust mechanism which exhausts the air from the enclosure. The rate at which the air is pushed into the enclosure is less than the rate at which the air is expelled from the enclosure and the two rates are optimized such that the pressure differential between the pressure within the enclosure and the ambient pressure outside the enclosure is minimized. By minimizing this pressure drop, the airflow mechanisms are able to operate more efficiently, that is, they are able to operate at substantially near their design speed.

Embodiments of this aspect can include one or more of the following features. The airflow mechanisms can be fans. There can be two fans mounted adjacent to each other for pushing air into the enclosure, and there can be two fans also mounted adjacent to each other for expelling the air from the enclosure. Each fan module may be removable, such that when one fan fails it may be removed while the other fans continue to operate to prevent thermal damage of the components within the enclosure. Each fan module, along with any replacement fan module, can be placed in the enclosure interchangeably, without modification, in any of the four locations. All of the fan modules are keyed or polarized to the full extent so as not to adversely affect the air flow direction or the performance of the heat transfer capabilities of the system within the enclosure.

In other embodiments of this aspect, the system can include a controller for variably controlling the speed of the airflow mechanisms or operating the airflow mechanism at a preset speed. The first airflow mechanism can be mounted in a lower half portion of the enclosure, while the second airflow mechanism is mounted in an upper half portion of the enclosure.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIG. 2b is a view of a connector cable of the fan module of FIG. 2a.

FIG. 3b is an exploded isometric view of the panel of FIG. 3a.

DETAILED DESCRIPTION OF THE INVENTION

Figure 1:
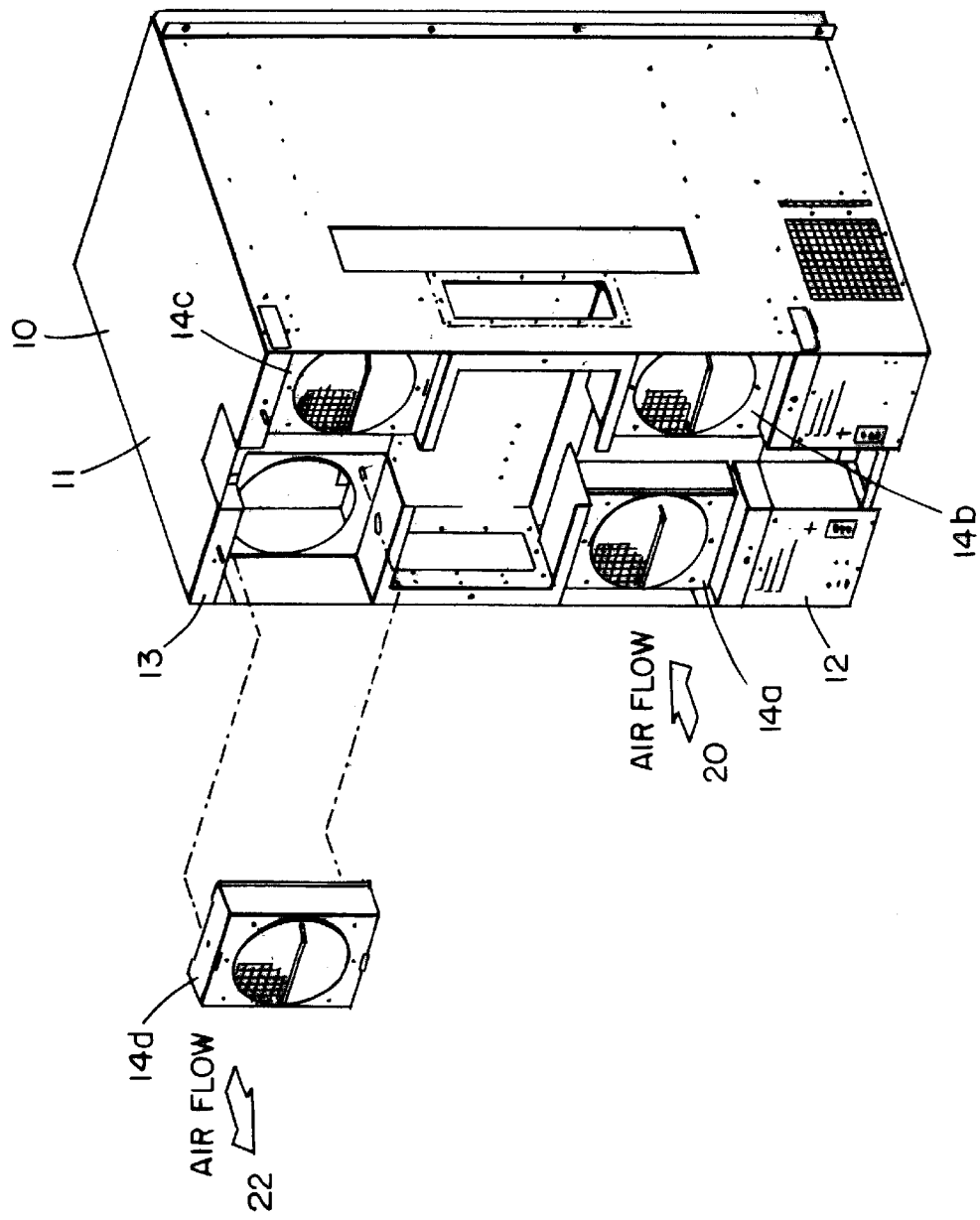
FIG. 1 is an isometric view of an enclosure for a telecommunications product with a cooling system in accordance with an embodiment of the present invention.

A description of preferred embodiments of the invention follows. Referring to FIG. 1, there is illustrated a system for cooling a telecommunications enclosure. As shown in FIG. 1, an enclosure 10 houses electronic components (not shown) within the enclosure and includes a rear mounting panel 12 in which four fan modules 14a, 14b, 14c, and 14d, collectively referred to as modules 14, are mounted. Enclosure 10 includes a front casing 11 that is provided with keying tabs 13 to ensure a proper fit between the front casing 11 and the rear mounting panel 12.

Figure 2A:
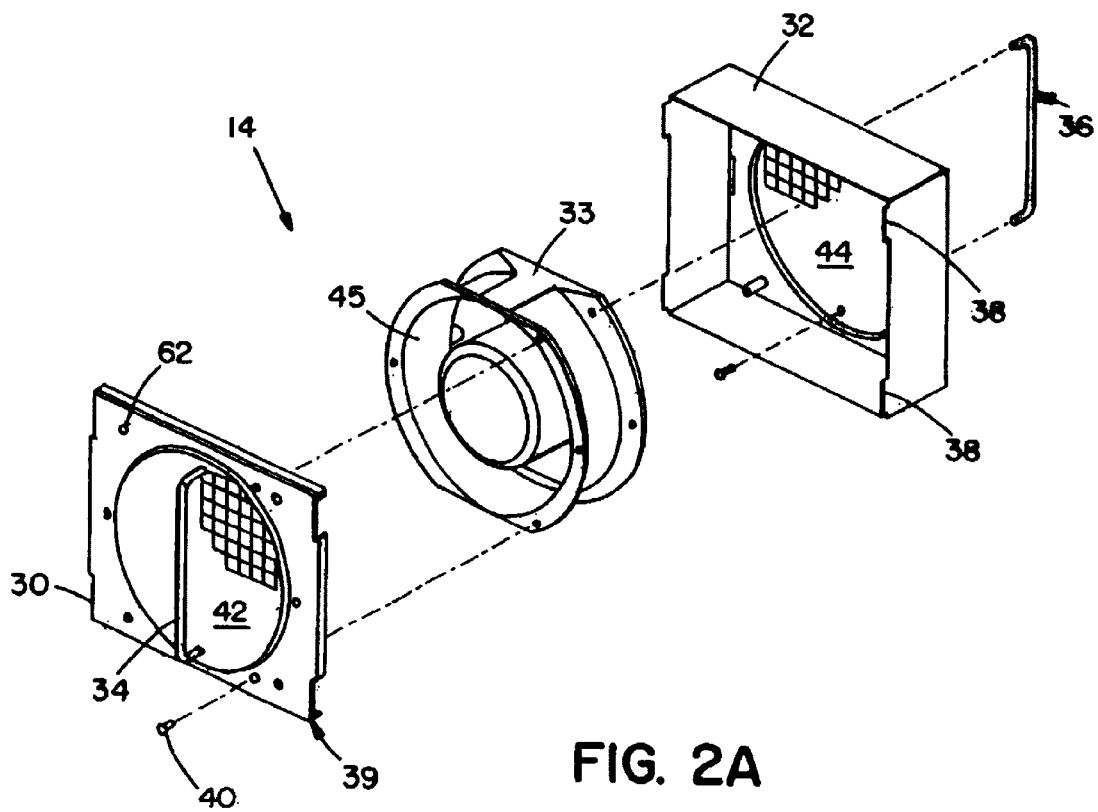
FIG. 2a is an exploded perspective view of a fan module of the cooling system of FIG. 1.
Figure 2B:
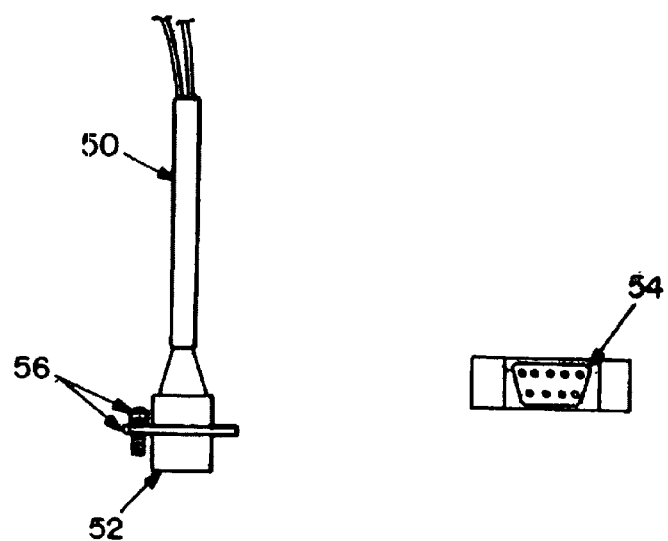

Referring now to FIG. 2a, each fan module 14 includes a front plate 30 and a back encasing 32 which encase a fan assembly 33. The fan module 14 also includes a front handle 34 and a back handle 36 which can be grabbed by an operator to assist in placing and removing the module for the mounting panel 12 of the enclosure 10. The back housing 32 is provided with a set of keying tabs 38 which fit into a set of slots 39 of the front plate 30. The front plate 30, the back housing 32 and the fan assembly 33 are held together by a set of screws 40. The front plate 30 and the back housing 32 are provided with respective screened openings 42 and 44. These openings have diameters of approximately the same size as a circular opening 45 of the fan assembly 33. The fan assembly 33 holds a set of fan blades and a motor 48. A power cable 50 (FIG. 2b) extends from each fan module 14 and includes a connector 52 which plugs into a connector housing 54 located inside the enclosure 10. The connector 52 has two screws 56 attached to the connector housing 54, used for attaching the connector 52 to the inside of the enclosure 10.

Figure 3A:
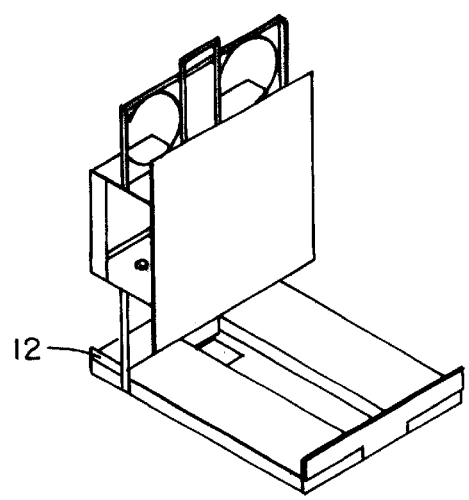
FIG. 3a is an isometric view of a panel of the housing of FIG. 1 in which the module of FIG. 2 is mounted.
Figure 3B:
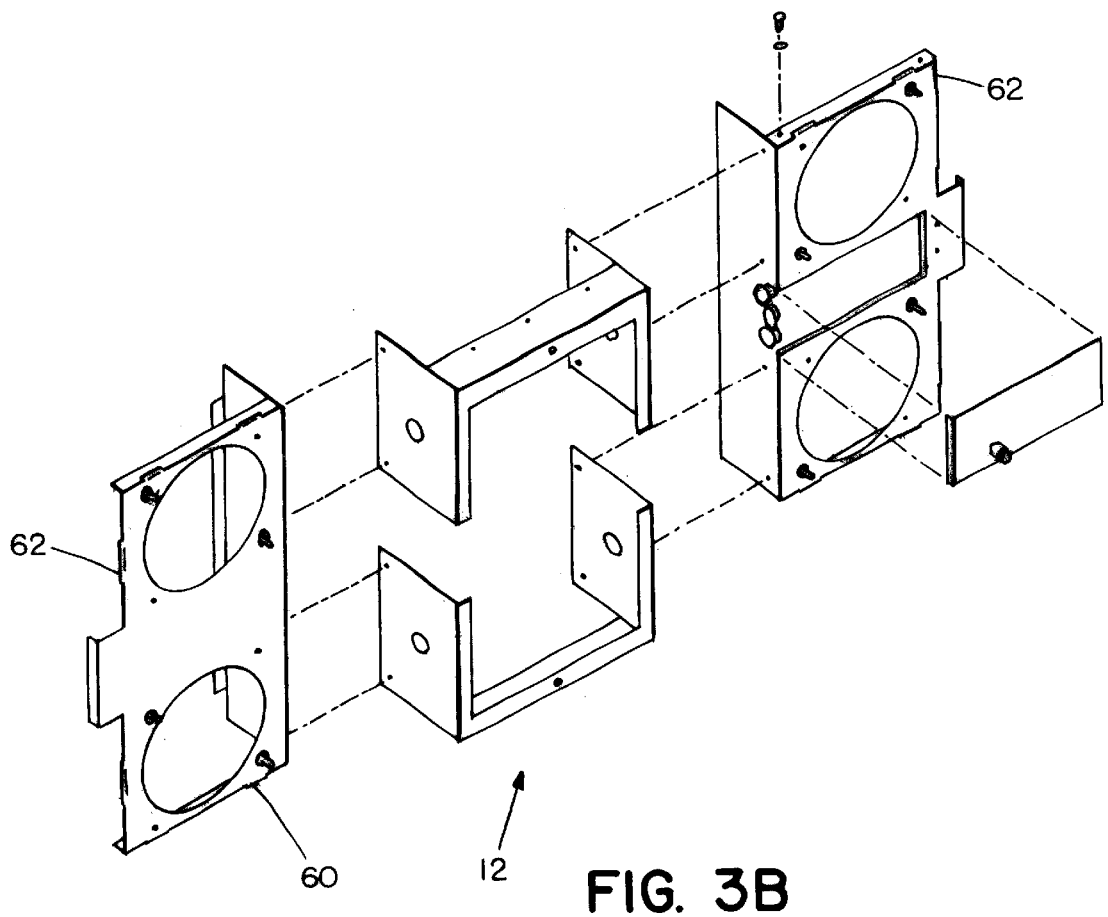

Referring also to FIGS. 3a and 3b, the rear mounting panel 12 is provided with a set of keying stubs 60 which engage with a set of keying holes 62 of the front plate 30 of the fan module 14. These stubs 60 provide the keying and orientation for each fan module 14 as they relate (mount) to the rear panel 12. Since all the fan modules 14 are identical, the top fan modules 14c and 14d can only go into the rear panel 12 in one direction and the bottom fan modules 14a and 14b can only be mounted in the opposite direction as allowed by the stubs 60. This prevents placing the fan modules in the wrong locations. The rear mounting panel 12 is also provided with a set of keying slots 64 which engage with the keying tabs 13 of the front casing 11. Each fan module 14, as well as any replacement fan module, can be placed in the enclosure 10 without modifying the module in any of the four locations of the rear panel 12. Thus the fan modules 14 are fully interchangeable. The fan modules 14 are keyed, or polarized, to ensure that they are properly oriented in the rear panel 12 so as not to adversely affect the air flow direction through the enclosure 10 or the performance of the heat transfer capabilities of the cooling system.

Although the front plate 30 and the back housing 32 of the fan module 14 are typically made of metal, they can be made from plastics. The stubs 60 are made of metal for durability.

In use, fan modules 14*a* and 14*b* push air into the enclosure, as indicated by arrow 20. The air circulates about the components inside the enclosure thereby cooling the components. Fan modules 14*c* and 14*d* exhaust air from the enclosure in the direction as shown by arrow 22. In the present embodiment, the fan modules operate at a predefined speed. For example, modules 14*a* and 14*b* each operate at approximately 240 cubic feet per minute (CFM), while each of modules 14*c* and 14*d* are designed to operate at about 300 CFM. The upper modules 14*c* and 14*d* must operate at a higher speed because of the thermal expansion of the air as it is heated while flowing about the heat generating components. Note, the push (modules 14*a* and 14*b*)/pull (modules 14*c* and 14*d*) arrangement of the configuration shown in the drawings. If the upper modules operate alone, the pressure differential between that within the enclosure and the ambient outer pressure is larger than when these modules operate in series with the lower modules 14*a* and 14*b*. In essence, the "pushing" of the air by modules 14*a* and 14*b* lowers the system impedance of the air flow through the enclosure. By doing so, both the upper and lower fan modules are able to operate more efficiently.

When a fan module fails, the module can easily be removed from the rear mounting panel 12. The system is designed such that the fans that have not failed continue to operate at their predefined speed while the failed fan is replaced. Even in such circumstances, the system is able to adequately cool the electronic components within the enclosure to prevent thermal damage to the components.

To properly choose fans that able to dissipate the generated heat within the enclosure, the heat generated must be approximated and the system impedance must be calculated.

The major sources of resistance within the enclosure include the resistance of the channels between the boards, the boards themselves, and the openings for the air into and out of the board chassis. In the present example, the dimensions of the board channels are as follows: height, H, is about 18 inches, width, W, is about 1.11 inches, and the depth, D, is about 15 inches.

The resistance of the board channels is calculated to be $$Rbc = \frac{3.1 \times 10^{-4} \times H}{(W \times D)^2} = \frac{3.1 \times 10^{-4} \times 18}{(1.11 \times 15)^2} = 20.13 \times 10^{-6}$$

in units of $$\frac{\text{in} \cdot \text{H}_2\text{O}}{\left(\frac{\text{ft}^3}{\text{min}}\right)^2}$$

The total resistance of the boards in the systems is calculated to be $$Rboards = \left(\frac{1}{\frac{14}{\sqrt{Rbc}}}\right)^2 = \left(\frac{1}{\frac{14}{\sqrt{20.13 \times 10^{-6}}}}\right)^2 = 0.109 \times 10^{-6}$$

And the resistance of the slots are found to be $$Rslot = \frac{2.4 \times 10^{-3}}{Af^2} = \frac{2.4 \times 10^{-3}}{(18 \times 15 \times 0.5)^2} = 0.132 \times 10^{-6}$$

where Af is the open cross sectional area of a slot, with 50% of the cross section open.

The total system impedance is then $$Rsystem = Rslot + Rboards = 2 \times 0.132 \times 10^{-6} + 0.106 \times 10^{-6}$$

thus, $$Rsystem = 0.373 \times 10^{-6}$$

The heat generated, W, within the enclosure 10 in the present example is approximately 2000 Watts, and the airflow, Q (in units of CFM), needed to dissipate that heat is $$Q = \frac{W}{c_p \rho \Delta T} = \frac{1.76 \times W}{\Delta T} = \frac{1.76 \times 2000 \text{ Watts}}{15^\circ \text{ C.}} = 235 CFM$$

where $c_p$ is the specific heat of air at sea level, p is the density of air at sea level, and $\Delta T$ is the maximum allowable temperature rise in the system, which is about 15° C.

With the estimated airflow and system impedance calculated above, the pressure loss in the system can be calculated from the relation $$Psystem = Rsystem \times Q^2 = 0.373 \times 10^{-6} \times 235^2 = 0.021$$

in units of in. H$_2$O. Thus with a 235 CFM requirement across a pressure of 0.021 in H$_2$O, appropriate fans were selected based on their static pressure curves.

Figure 4:
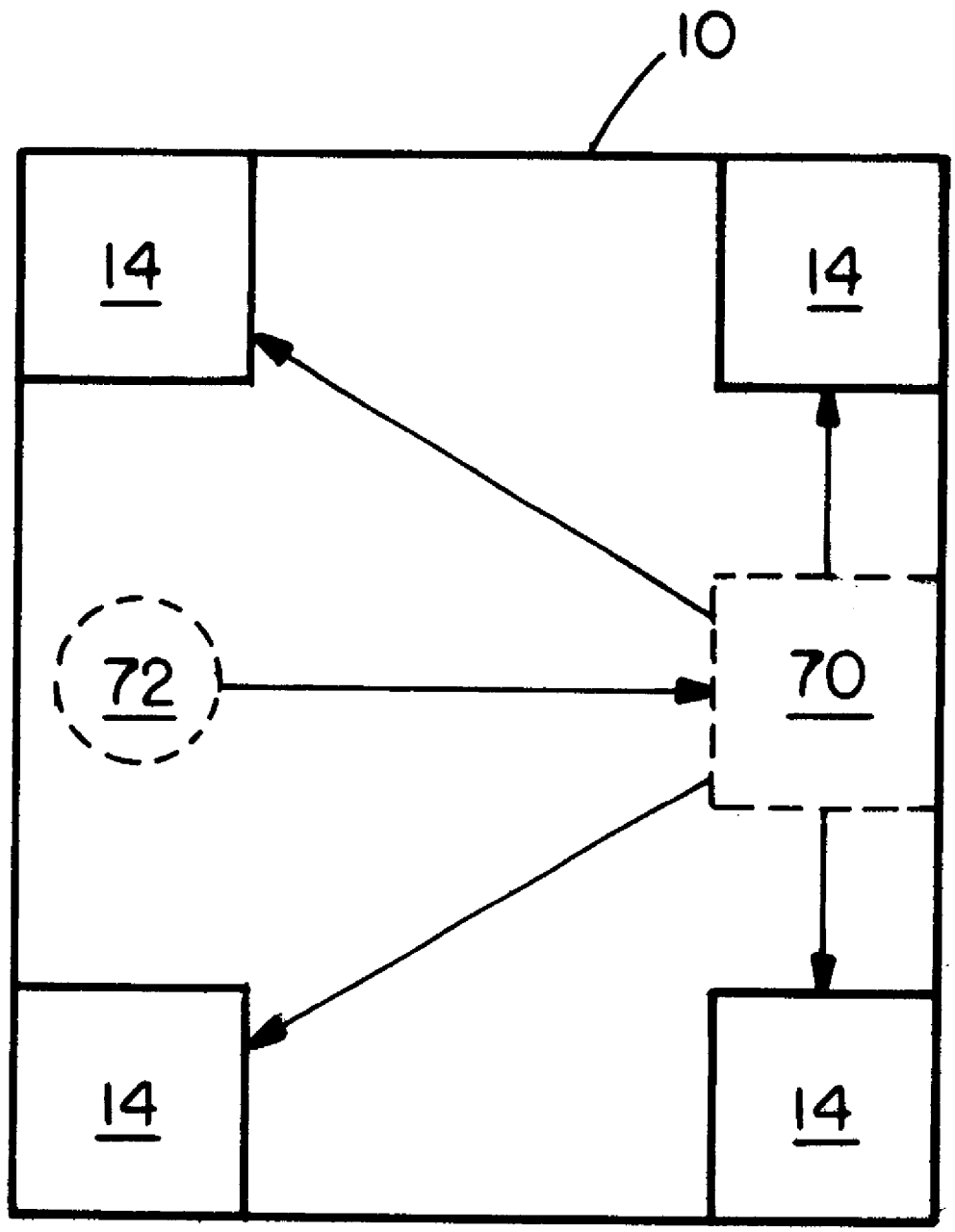
FIG. 4 is a block diagram of a control system for the cooling system of FIG. 1.

In the embodiment discussed above, a controller coupled to the fans operates the fans at a preset speed. However, in alternative embodiments of the system, as illustrated in FIG. 4, a microprocessor-based controller 70 in conjunction with a temperature sensor 72, such as a thermistor, detects high temperature conditions and varies the speed of the fans 14 to accommodate higher temperatures. When abnormally high temperatures are detected, for example, when one fan fails, the other fans operate at their maximum speed. The fans may also default to a maximum speed when the controller fails or when the controller is removed from the device for replacement.

Both the intake and exhaust fans can use 48 volts of DC nominal operating voltage. The fan module can also provide a tachometer output, which is referenced to a negative lead supply and produces two pulses per revolution. There can be a programmable speed control, which provides variable speed operation by pulse width modulation. The fan speed can be proportional to the duty cycle present on the fan input. Maximum speed is obtained when the lead is open and it drops down to a minimum speed when the lead connects to the negative lead of the fan supply voltage.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for cooling a telecommunications device, comprising:
    a low speed airflow mechanism mounted in an enclosure of the device and oriented within the device to induce air into the enclosure;
    a high speed airflow mechanism mounted in the enclosure of the device and oriented for expelling air out of the device; and
    a controller connected to the low and high speed airflow mechanisms to control the speed of the fans.

2. The apparatus of claim 1, wherein the low speed airflow mechanism is a first fan, and the high speed airflow mechanism is a second fan.

3. The apparatus of claim 2, further comprising two additional fans, a second low seed fan being mounted to the first fan and oriented to induce air into the enclosure, and a second high speed fan being mounted adjacent to the third fan and oriented to exhaust air from the enclosure.

4. The apparatus of claim 3, wherein each fan is removable.

5. The apparatus of claim 4, wherein when one fan fails and an abnormally high temperature is detected from the failure and as a result the other fans speed is increased.

6. The apparatus of claim 1, wherein the low speed airflow mechanism and the high speed air flow mechanism are interchangeable modules.

7. The apparatus of claim 6, wherein the modules are keyed to ensure the proper orientation of the modules when mounted in the enclosure so that the airflow direction through the enclosure is not adversely affected.

8. The apparatus of claim 1, wherein the controller is programmable such that the speed control of each mechanism is variable.

9. The apparatus of claim 1, wherein the controller operates the low speed airflow mechanism and the high speed airflow mechanism at preset speeds.

10. The apparatus of claim 1, wherein the low speed airflow mechanism is mounted in a lower half portion of the enclosure.

11. The apparatus of claim 1, wherein the high speed airflow mechanism is mounted in the upper half portion of the enclosure.

12. The apparatus of claim 1, wherein the low speed airflow mechanism and the high speed airflow mechanism are removable from the enclosure.

13. The apparatus of claim 1, wherein the low speed airflow mechanism operates in series with the high speed airflow mechanism.

14. The apparatus of claim 1, wherein the low speed airflow mechanism and the high speed airflow mechanism are controlled to operate at preset speeds.

15. The apparatus of claim 1, wherein the low speed airflow mechanism and the high speed airflow mechanism are controlled to operate at variable speeds.

16. A method for cooling an telecommunications device, comprising the steps of:
    inducing air into an enclosure with a low speed airflow mechanism; and
    expelling air of the device with a high speed airflow mechanism.

17. The method of claim 16, further comprising the step of variably controlling the speed of the low speed airflow mechanism and the speed of the high speed airflow mechanism.

18. The method of claim 16, further comprising the step of controlling the low speed airflow mechanism and the high speed airflow mechanism to operate at preset speeds.

* * * * *

UNITED STATES PATENT AND TRADEMARK OFFICE
CERTIFICATE OF CORRECTION

| | |
|---|---|
| PATENT NO. | : 6,646,877 B2 |
| DATED | : November 11, 2003 |
| INVENTOR(S) | : Arthur G. Willers and Stanton Kent |

It is certified that error appears in the above-identified patent and that said Letters Patent is hereby corrected as shown below:

Column 5,
Line 26, replace the word "seed" with -- speed --

Signed and Sealed this

Second Day of November, 2004

JON W. DUDAS
*Director of the United States Patent and Trademark Office*